United States Patent
Das et al.

(10) Patent No.: US 11,836,000 B1
(45) Date of Patent: Dec. 5, 2023

(54) AUTOMATIC GLOBAL CLOCK TREE SYNTHESIS

(71) Applicant: Synopsys, Inc., Sunnyvale, CA (US)

(72) Inventors: Partha Das, Cupertino, CA (US); Tao Lin, Palo Alto, CA (US); Min Pan, Fremont, CA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/956,597

(22) Filed: Sep. 29, 2022

(51) Int. Cl.
*G06F 1/10* (2006.01)
*H03K 5/13* (2014.01)

(52) U.S. Cl.
CPC ............. *G06F 1/10* (2013.01); *H03K 5/13* (2013.01)

(58) Field of Classification Search
CPC ................................... G06F 1/10; H03K 5/13
USPC ........................................................ 327/106
See application file for complete search history.

(56) References Cited

U.S. PATENT DOCUMENTS

| | | | | |
|---|---|---|---|---|
| 6,782,519 B2* | 8/2004 | Chang | ...................... | G06F 30/30 716/122 |
| 7,051,310 B2* | 5/2006 | Tsao | ......................... | G06F 30/30 716/124 |
| 7,225,421 B2* | 5/2007 | Migatz | ...................... | G06F 30/39 716/135 |
| 7,418,689 B2* | 8/2008 | Habitz | ................... | G06F 30/394 716/130 |
| 8,205,182 B1* | 6/2012 | Zlatanovici | ........... | G06F 30/327 716/113 |
| 9,310,831 B2* | 4/2016 | Sunder | ................... | G06F 30/396 |
| 9,747,397 B2* | 8/2017 | Sunder | ................... | G06F 30/398 |
| 9,773,079 B2* | 9/2017 | Taskin | .................... | G06F 30/367 |
| 10,068,048 B1* | 9/2018 | Eslami Dehkordi | . | G06F 30/398 |
| 10,146,897 B1* | 12/2018 | Sunder | ..................... | G06F 17/11 |
| 10,296,686 B1* | 5/2019 | Krishnamurthy | ........ | G06F 30/33 |
| 10,380,299 B2* | 8/2019 | Sunder | ................... | G06F 3/0482 |
| 10,796,066 B1* | 10/2020 | Farshidi | .............. | G06F 30/3312 |
| 10,936,783 B1* | 3/2021 | Chapman | .............. | G06F 30/396 |
| 10,963,618 B1* | 3/2021 | Farshidi | ................ | G06F 30/396 |
| 11,188,702 B1* | 11/2021 | Jiang | ..................... | G06F 30/398 |
| 2003/0135836 A1* | 7/2003 | Chang | ..................... | G06F 30/30 716/126 |
| 2007/0288875 A1* | 12/2007 | Eakins | ................ | G06F 30/3312 716/139 |
| 2009/0064067 A1* | 3/2009 | Liu | ...................... | G06F 30/3312 716/113 |

* cited by examiner

*Primary Examiner* — Ryan Jager
(74) *Attorney, Agent, or Firm* — Weaver Austin Villeneuve & Sampson LLP

(57) ABSTRACT

A method of determining a clock tree for a circuit includes, in part, generating a multitude of symmetric clock configurations characterized by a multitude of columns and a multitude of rows. For each symmetric clock configuration, the method further includes, in part, selecting positions of a multitude of tap points defined by a multitude of end points of the multitude of rows, estimating a first cost from a tree root to each of the first multitude of tap points, estimating a second cost from the multitude of tap points to a multitude of clock sinks associated with the multitude of tap points, and determining the symmetric clock configuration cost in accordance with the first cost and the second cost.

20 Claims, 10 Drawing Sheets

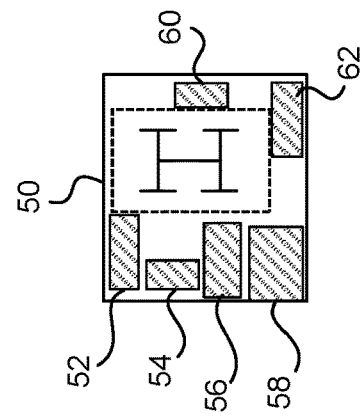
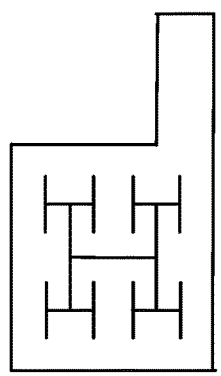
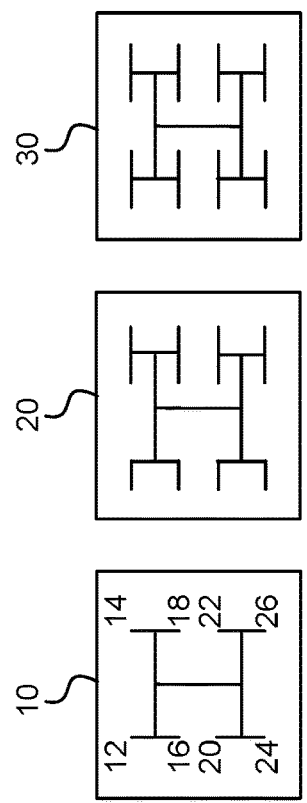

AUTOMATIC GLOBAL CLOCK TREE SYNTHESIS

TECHNICAL FIELD

The present application relates to integrated circuits, and more particularly to synthesizing a clock tree in an integrated circuit.

BACKGROUND

Clock signal distribution is critical to the design of advanced high-frequency circuits. The distribution of the clock signal is typically achieved by way of a clock tree that delivers the clock signal from a clock source, also referred to as the clock root, to a multitude of sequential and combinatorial logic, often referred to as clock sinks. A clock tree ideally delivers the clock signal to the various clock sinks with the same delay.

SUMMARY

A method of determining a clock tree for a circuit, in accordance with one embodiment of the present disclosure, includes, in part, generating, by a processing device, a multitude of symmetric clock configurations characterized by a multitude of columns and a multitude of rows. For each symmetric clock configuration, the method further includes, in part, selecting positions of a multitude of tap points defined by a multitude of end points of the multitude of rows, estimating a first cost from a tree root to each of the first multitude of tap points, estimating a second cost from the multitude of tap points to a multitude of clock sinks associated with the multitude of tap points, and determining the symmetric clock configuration cost in accordance with the first cost and the second cost.

In one embodiment, estimating the first cost includes, in part, using at least a first delay associated with at least a first buffering stage between a first one of the multitude of tap points and the tree root. In one embodiment, estimating the second includes, in part, using at least a second delay associated with at least a second buffering stage between the first one of the multitude of tap points and a clock sink associated with the first one of the multitude of tap points.

In one embodiment, the drive strength of the at least first buffering stage is greater than a drive strength of the at least second buffering stage. In one embodiment, each of the first and second costs is defined by a latency. In one embodiment, each of the first second costs is defined by a clock skew. In one embodiment, each of the first and second costs is defined by a combination of latency and clock skew A method of determining a clock tree for a circuit, in accordance with one embodiment of the present disclosure, includes, in part, generating a multitude of asymmetric clock configurations using a k-means clustering algorithm, wherein each cluster corresponds to a tap point of each of the asymmetric clock configurations. For each asymmetric clock configuration, the method further includes, in part, estimating a first cost from a tree root to each of a multitude of tap points of the asymmetric clock configuration, estimating a second cost from the multitude of tap points to a multitude of clock sinks associated with the multitude of tap points, and determining the asymmetric clock configuration cost in accordance with the first cost and the second cost.

In one embodiment, estimating the first cost includes, in part, using at least a first delay associated with at least a first buffering stage between a first one of the multitude of tap points and the tree root. In one embodiment, estimating the second includes, in part, using at least a second delay associated with at least a second buffering stage between the first one of the multitude of tap points and a clock sink associated with the first one of the plurality of tap points.

In one embodiment, the drive strength of the at least first buffering stage is greater than the drive strength of the at least second buffering stage. In one embodiment, each of the first and second costs is defined by a latency. In one embodiment, each of the first second costs is defined by a clock skew. In one embodiment, each of the first cost and second cost is defined by a combination of latency and clock skew.

A method of synthesizing a clock tree for a circuit, in accordance with one embodiment of the present disclosure, includes, in part, generating, by a processing device, a multitude of symmetric and asymmetric clock configurations. For each of the multitude of the symmetric and asymmetric clock configurations, the method further includers, in part, estimating a first cost from a tree root to each of a multitude of tap points associated with the clock configuration, estimating a second cost from the multitude of tap points to a multitude of clock sinks associated with the multitude of tap points, and determining the clock configuration cost based on the first and second costs. The method further includes, in part, selecting one clock configuration from the multitude of the symmetric clock configurations and the asymmetric clock configurations based on the determined cost, and synthesizing the selected clock configuration.

In one embodiment, estimating the first cost includes, in part, using at least a first delay associated with at least a first buffering stage between a first one of the multitude of tap points and the tree root. In one embodiment, estimating the second cost includes, in part, using at least a second delay associated with at least a second buffering stage between the first one of the multitude of tap points and a clock sink associated with the first one of the multitude of tap points.

In one embodiment, the drive strength of the at least first buffering stage is greater than the drive strength of the at least second buffering stage. In one embodiment, each of the first and second costs is defined by a latency. In one embodiment, each of the first and second costs is defined by a clock skew.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIGS. 1A-1E show a multitude of H-trees for clock distribution.

DETAILED DESCRIPTION

Figure 2A:
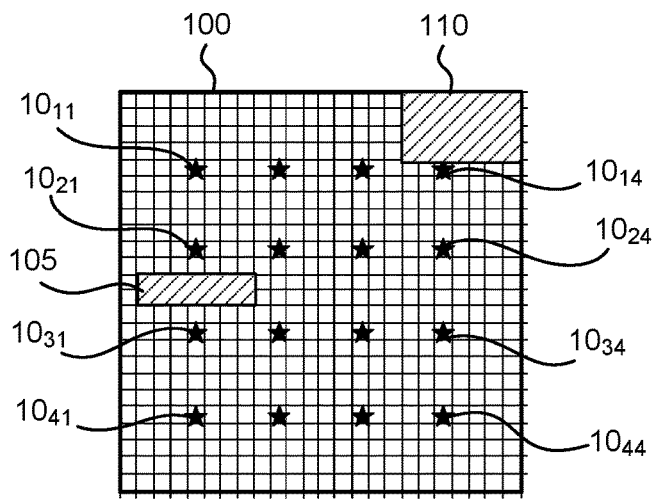
FIG. 2A shows an array of 4×4 taps positioned within a design bounding box that is divided into a multitude of horizontal and vertical grids, in accordance with one embodiment of the present disclosure.

Advances in semiconductor device and manufacturing technologies continue to lead to scaling down of transistor dimensions and an attendant increase in their density in integrated circuits. Designing a clock distribution network that ensures a multi-billion-transistor circuit operates properly and meets the specified timing requirements remains a challenge.

Designing a clock distribution network, alternatively referred to herein as a clock tree, such as those shown in FIGS. 1A-1E, typically involves the iterative and manual process of defining the number of clock subtrees, computing the delay associated with each clock subtree that leads to a clock sink, and determining the number of stages of the clock buffers as well as the sizes of the clock buffers that would be required to achieve a suitable delay and clock skew from the clock source to each clock sink. Such an iterative process that involves trial and error by a circuit designer becomes even more complicated and time consuming for a design that has a complex floorplan and for which the determination of the tap points for the clock tree becomes even more difficult.

In accordance with one embodiment of the present disclosure, a global clock tree synthesis tool automatically selects an optimal global tree configuration based on an estimated cost associated with the global clock tree and its subtrees. For a complex floorplan which does not readily lend itself to a single symmetric H-tree, the tool synthesizes an asymmetric clock tree based on an estimated cost. The cost for a symmetric H-tree or an asymmetric clock tree may include latency and/or clock skew.

In accordance with one embodiment of the present disclosure, the positions of the tap drivers (alternatively referred to herein as taps or tap points) of both symmetric and asymmetric clock configurations are automatically determined. When the clock configuration is selected to be symmetric and is an H-tree, the number of columns and rows of the H-tree, as well as its size and position within an IC floorplan are automatically determined. When the clock configuration is selected to be asymmetric, the tree delay is balanced such that the delays from the tree root to the clock sinks are substantially similar. A global clock tree synthesis tool, in accordance with embodiments of the present disclosure, provides a number of advantages such as automatic determination of the number of the taps and their positions, minimum clock insertion delay, tap insertion and assignment that are latency aware, and faster turn-around time due, in part, to using less hardware resources. Embodiments of the present disclosure dispense with the need for a user to explore different flows, and synthesizes the clock tree in a single pass.

To synthesize a clock tree, in accordance with one embodiment of the present disclosure, a multitude of symmetric clock configurations are generated using a maximum number of specified tap points that is referred to herein as max_taps. Thereafter, all permutations of a symmetric H-tree clock having m columns and n rows such that m×n≤max_taps are generated. It is understood that m and n are integer variables equal to or greater than 2. Next, for each of the H-trees, the tap points that result in the lowest estimated latency are selected as having the optimal locations for that H-tree.

A clock distribution network may have an H-tree configuration. FIG. 1A shows a 2×4 H-tree configuration whose end points 12, 14, 16, 18, 20, 22, 24 and 26 are disposed along 2 columns and 4 rows and is defined within bounding box 10. The first column of the H-tree of FIG. 1A is disposed along end points 12, 16, 20, 24; the second column of H-tree of FIG. 1A is disposed along end points 14, 18, 22, 26. The first row of H-tree of FIG. 1A is disposed along end points 12, 14; the second row of H-tree of FIG. 1A is disposed along end points 16, 18; the third row of H-tree of FIG. 1A is disposed along end points 20, 22; and the fourth row of H-tree of FIG. 1A is disposed along end points 24, 26. Each end point of the tree is referred to herein as a tap points or a tap driver.

FIG. 1B shows a 3×4 H-tree that includes 12 end points and is formed within bounding box 20. FIG. 1C shows a 4×4 H-tree that includes 16 end points and is formed within bounding box 30. FIG. 1D is a 4×4 H-tree formed within L-shaped bounding box 40. FIG. 1E shows a 2×2 H-tree formed within bounding box 50 that includes pre-positioned macro blocks 52, 54, 56, 58, 60 and 62, which thereby preclude positioning of the H-tree within the areas used by the macroblocks.

FIGS. 2A-2D show an example of the process used to select optimal locations for the tap drivers associated with a 4×4 H-tree clock, in accordance with one embodiment of the present disclosure. The bounding box 100 of the design layout is shown as having been divided into 23 horizontal and 23 vertical grids. Referring to FIG. 2A, The 16 tap points of the 4×4 tree are initially spaced symmetrically within the bounding box and at equal distances from one another. The tap points along the first row are identified as $10_{11}$, $10_{12}$, $10_{13}$, $10_{14}$; the tap points along the second row are identified as $10_{21}$, $10_{22}$, $10_{23}$, $10_{24}$; the tap points along the third row are identified as $10_{31}$, $10_{32}$, $10_{33}$, $10_{34}$, and the tap points along the fourth row are identified as $10_{41}$, $10_{42}$, $10_{43}$ and $10_{44}$.

The tap points are positioned so as not to be within macroblocks 105 and 110. A macroblock is understood herein to refer to an IC design block whose position within the design layout has been previously determined. The area assigned to a macroblock is therefore blocked and may not be used by any other circuit of the IC design. Due to the positions and sizes of the macroblocks, if one or more tap points cannot be placed at their location(s) as shown in FIG. 2A, the tap points may be displaced from their shown locations by one or more grids. If such a displacement is greater than a predefined value (e.g. 3 grids), or if the positions of a tap point is such that it inhibits the placement of a clock sink, then the tap point may be removed. For example, if the displacement causes the tap point to be sufficiently close to another tap point which has already been associated with a clock sink closest to the displaced tap point, then the displaced tap point may be removed. Next, a cost associated with the configuration of the tap points shown in FIG. 2A is determined. In one embodiment, the cost may be defined by an estimated latency associated with the positions of the tap points, as described further below. In one embodiment, the cost may be defined by an estimated clock skew associated with the positions of the tap points. In one embodiment, the cost may be defined by a combination of the latency and clock skew associated with the positions of the tap points.

Figure 2B:
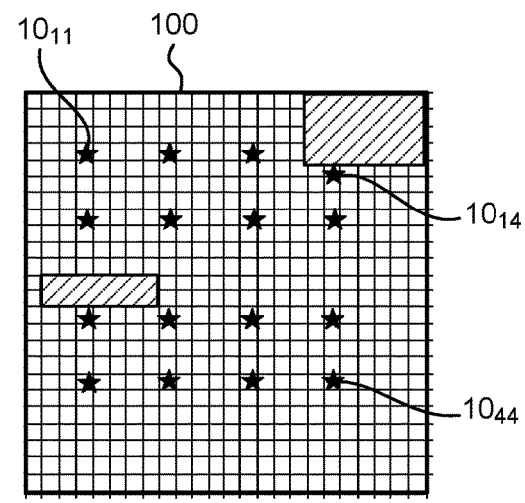
FIG. 2B shows the array of taps of the FIG. 2A after the taps have been repositioned, in accordance with one embodiment of the present disclosure.

Thereafter, the positions of the taps points are adjusted by, for example, one or two grids along the rows and columns while maintaining the symmetry of the taps. FIG. 2B shows the tap points of FIG. 2A after the tap points along the first row are moved up by one grid, the tap points along the second row are moved up by two grids, and the entire array of the tap points is moved to the left by one grid. Because the repositioning of the tap points causes tap point $10_{14}$ to fall within macroblock 110 by less than, e.g., two grids, tap point $10_{14}$ is not moved or removed.

To maintain the symmetry in the positioning of the tap points, the tap points along the third and fourth rows are moved up by one and two grids, respectively. Due to the symmetry of the tap points in FIG. 2B, the distance between the first and second rows is kept equal to the distance between the third and fourth rows. The cost associated with the tap positions in FIG. 2B is then computed. If the cost associated with the tap points shown in FIG. 2B, is less than the cost associated with the tap points in FIG. 2A, then the tap points as shown in FIG. 2B are selected for cost comparison with other tap positions of the 4×4 H-tree. In accordance with one aspect of the present disclosure, an entire row or column of tap points are moved together.

Figure 2C:
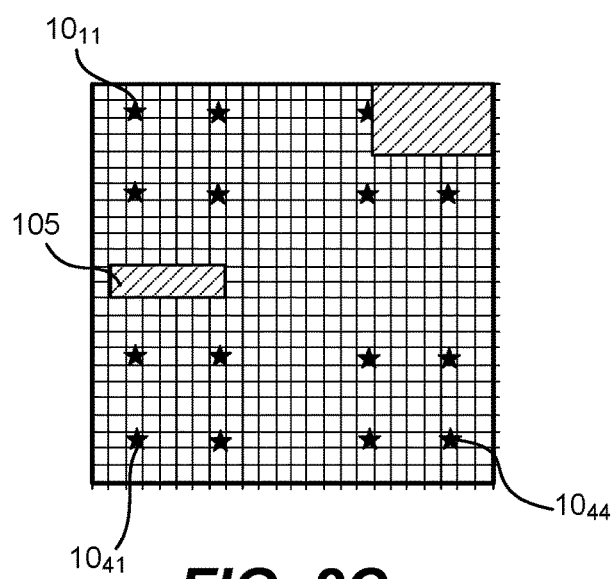
FIG. 2C shows the array of taps of the FIG. 2A after the taps have been repositioned, in accordance with one embodiment of the present disclosure.

The process of moving the tap points and computing its associated cost continues until either the cost does not reduce any further, or the spacing between adjacent rows and columns falls below a minimum required threshold value, such as three grids. FIG. 2C shows the tap points of FIG. 2A after the tap points along the first and second rows are moved up by three grid, the tap points along the third and fourth rows are moved down by two grids, and the entire array of the tap points is moved to the left by two grids.

Because the repositioning of the tap points along the first row causes tap point $10_{14}$ to be placed within macroblock 110 by, for example, more than two grids, tap point $10_{14}$ is eliminated from further consideration. Excluding tap point $10_{14}$, the symmetry in the positioning of the tap points is maintained in FIG. 2C. The cost associated with the tap positions in FIG. 2C is then computed. If the cost associated with the tap points shown in FIG. 2C is less than the cost associated with the tap points in FIG. 2B, then the tap points in Figured 2C are selected for cost comparison with other tap positions of the 4×4 H-tree.

Figure 2D:
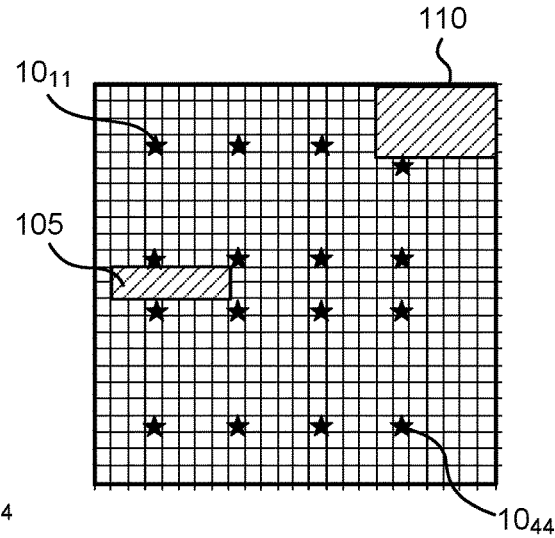
FIG. 2D shows the array of taps of the FIG. 2A after the taps have been repositioned, in accordance with one embodiment of the present disclosure.

FIG. 2D shows the tap points of FIG. 2A after the tap points along the first row are moved up by one grid, the tap points along the second row are moved down by one grid, the tap points along the third row are moved up by one grid, the tap points along the fourth row are moved down by one grid, and the entire array of the tap points is moved to the left by one grids. Because the movement of the tap points along the first row causes tap point $10_{14}$ to fall within macroblock 110 by less than e.g., two grids, tap point $10_{14}$ is not removed and maintains its previous position.

Assuming that the tap points shown in FIG. 2C have a lower cost than the tap points shown in FIGS. 2A and 2B, the cost associated with the tap points in FIG. 2D is then computed and compared to the cost associated with the tap positions in FIG. 2C. The process of changing the tap positions and computing the cost associated with their new positions is repeated until the tap positions having the lowest cost is identified. In some embodiments, the process of changing the tap positions and determining their associated cost may be repeated, e.g., 100 times or more, until the cost does not decrease any further. In some embodiments, the process of changing the tap positions and determining their associated cost is repeated until the separation between adjacent rows or columns of the taps becomes less than a minimum require threshold spacings, such as three grids.

The above process is repeated for all permutations of a symmetric H-tree clock having m columns and n rows (m and n are integers greater than 2), subject to the condition that that m×n≤max_taps, until for each such permutation the optimal tap points having the lowest estimated cost is identified. For example, if max_taps is 12, the process shown in FIGS. 2A-2D is repeated for each of H-trees 2×2, 2×3, 2×4, 2×5, 2×6, 3×2, 3×3, 3×4, 4×2, 4×3, 5×2, 6×2 until the lowest estimated cost for each of these subtrees is determined. Parameter max_taps may be set by a user or a tool selecting or synthesizing the clock tree.

After selecting the optimal locations for the tap points for all symmetric tap configurations with m columns and n rows, embodiments of the present disclosure may generate an asymmetric clock configuration using a clustering technique, such as K-means clustering technique, where K is varied from 2 to max_taps. An asymmetric clock configuration may be used when due to the layout of the design and the pre-defined positions of its macros, the tap points cannot be placed within rows and columns.

For each value of K, a tap is positioned near the center of the cluster and the cost associated with the tap is determined.

Thereafter, for each K, the cluster/tap whose associated cost is greater than a threshold value is partitioned further so as to create new clusters each having a tap point in a region near the center of the cluster. The costs associated with the new taps are then compared to the threshold value to determine whether the clusters should be partitioned further. The process of partitioning the clusters and determining their associated costs is repeated until the cost does not decrease any further or until the number of partitions reaches max_taps. In one embodiment, the cost associated with each tap is determined by estimating its subtree latency, and the threshold value to which the cost is compared is defined by an average of the subtree latencies, as described further below.

Figure 3:
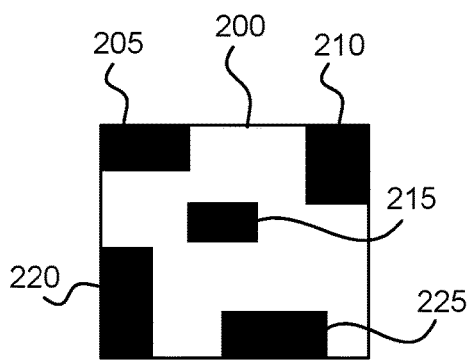
FIG. 3 is a simplified layout of a design bounding box that includes a number of macroblocks and in which an asymmetric clock distribution network is to be synthesized, in accordance with one embodiment of the present disclosure.

FIG. 3 shows a design layout having a bound box 200 and five macroblocks 205, 210, 215, 220 and 225 whose positions are predefined as shown. It is assumed that the available space in the layout shown in FIG. 3 does not lend itself to a symmetric H-tree clock configuration. In other words, given the number and positions of the macro blocks shown in FIG. 3, a relatively large number of tap points would be eliminated to maintain the symmetry required by a symmetric H-tree clock configuration, thereby increasing the cost associated with the symmetric H-tree clock configuration and thus rendering the symmetric H-tree clock configuration unsuitable for use for the layout shown in FIG. 3, Accordingly, a clustering algorithm, such as K-means clustering algorithm, where K is an integer ranging from 2 to max_taps, is applied to generate an asymmetric clock configuration for the layout shown in FIG. 3.

Figure 4A:
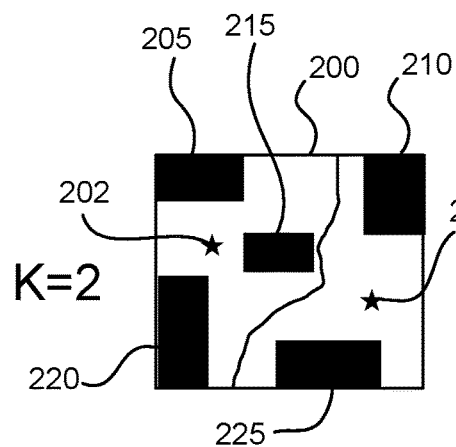
FIG. 4A shows the design layout of FIG. 3 after it is initially partitioned into two clusters, in accordance with one embodiment of the present disclosure.
Figure 4B:
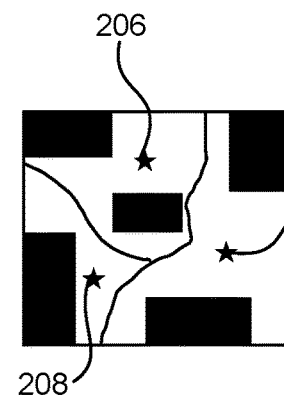
FIG. 4B shows the design layout of FIG. 4A after one of its clusters is partitioned into two clusters, in accordance with one embodiment of the present disclosure.
Figure 4C:
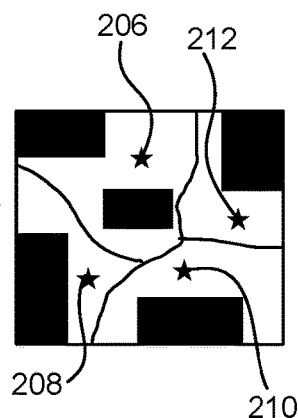
FIG. 4C shows the design layout of FIG. 4B after one of its clusters is partitioned into two clusters, in accordance with one embodiment of the present disclosure.
Figure 4D:
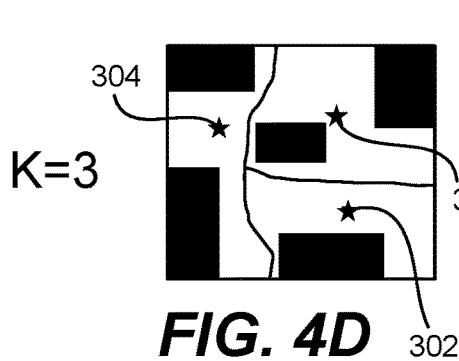
FIG. 4D shows the design layout of FIG. 3 after the design layout is initially partitioned into three clusters, in accordance with one embodiment of the present disclosure.
Figure 4E:
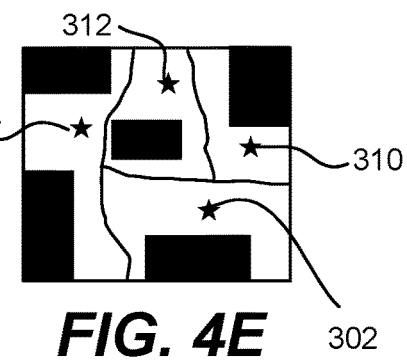
FIG. 4E shows the design layout of FIG. 4D after one of clusters the design layout is partitioned into two clusters, in accordance with one embodiment of the present disclosure.
Figure 4F:
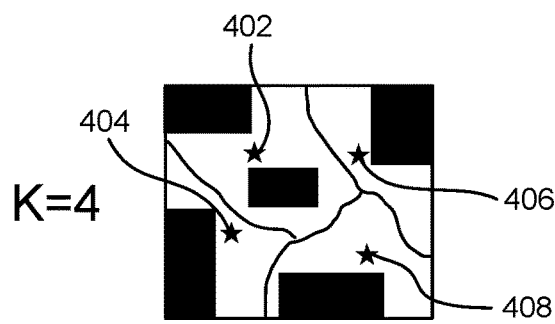
FIG. 4F shows the design layout of FIG. 3 after the design layout is initially partitioned into four clusters, in accordance with one embodiment of the present disclosure.

FIGS. 4A, 4D and 4F show the layout of FIG. 3 as divided initially into 2, 3 and 4 partitions, respectively. In the example shown in FIGS. 4A-4F, max_taps is assumed to be equal to 4. It is understood, however that max_taps may have a larger value, such as 64. Referring to FIG. 4A, tap points 202 and 204 are positioned within their respective partitions by the clustering algorithm. Because the cost associated with tap point 202 is determined to be larger than the threshold cost, the partition (cluster) associated with tap 202 is divided into two partitions to generate the partitions having tap points 206 and 208, as shown in FIG. 4B. The tap points in their associated clusters shown in FIG. 4B cause a change in the threshold cost. Because the cost associated with tap point 204 is determined to be greater than the updated threshold cost, the partition associated with tap point 204 is further divided into two partitions having tap point 210 and 212, as shown in FIG. 4C. Because max_taps is assumed to be 4 in this example, the partitions shown in FIG. 4C are not divided any further.

FIG. 4D shows the initial portioning (clustering) of the design layout of FIG. 3 based on a K value of 3, i.e., it has 3 clusters. The tap points associated with the three partitions in FIG. 4D are 302, 304 and 306. The cost associated with partition 306 is determined to be greater than the threshold cost. Accordingly, the partition in which tap point 306 is disposed is further divided into two partitions having tap points 310 and 312, as shown in FIG. 4E. Because max_taps is assumed to be 4 in this example, the partitions shown in FIG. 4E are not divided any further.

FIG. 4F shows the initial partitioning of the design layout of FIG. 3 based on a K value of 4 thus resulting into 4 partitions. The tap points associated with the four partitions shown in FIG. 4E are 402, 404, 406, and 408. Because max_taps is assumed to be 4 in this example, the partitions shown in FIG. 4F are not divided any further. The process of forming the initial partitions, dividing the partitions as required, and determining their associated costs are repeated until the cost does not decrease any further or until the number of partitions reaches max_taps. The tap points associated with the partition that has the least associated cost (e.g., the lowest latency) are then selected for the synthesis of an asymmetric clock configuration.

Figure 5:
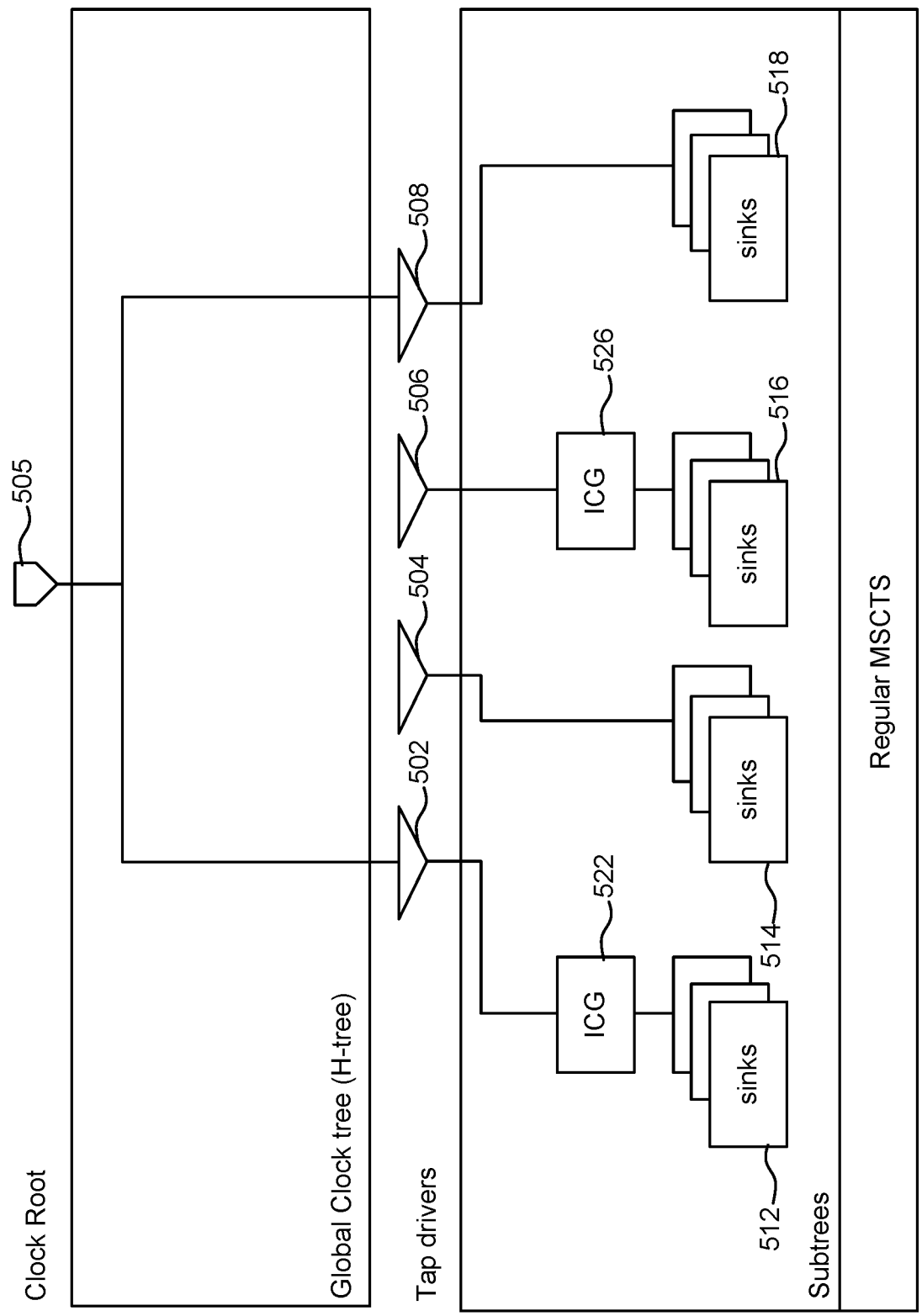
FIG. 5 shows a clock distribution network that includes a tree root, and a multitude of tap drivers each driving one or more associated clock sinks.

To determine the cost associated with the tap points associated with each symmetric clock configuration or each asymmetric clock configuration, as described above, clock sinks are distributed to their respective tap points based on their physical locations. FIG. 5 shows an example of an H-tree root 505 that is distributed to tap points 502, 504, 506 and 508. Tap points 502, 504, 506 and 508 represent the tap points associated with any of the symmetric H-tree or asymmetric clock configurations as described above. Although the example of FIG. 5 shows only 4 tap points, it is understood that the number of tap points may be larger or fewer than four. For example, in a 6×2 H-tree, the number of tap points is 12.

The tap points are also distributed to their respective clock sinks 512, 514, 516 and 518. Clock sinks 512 and 516 have associated integrated clock gating circuits (ICG) 522 and 526 that are also shown as being disposed between their respective tap points and clock sinks. Accordingly, each tap point drives a subtree that ends in a clock sink, i.e., one or more registers, as specified by the design. Therefore, the root of each subtree is a tap point and the end-point of each subtree is a register.

After forming a global H-tree that includes the clock root 505 and the tap points 520, 504, 506, 508, one or more stages of buffers (repeaters) are used between the clock root 505 and the tap points 502, 504, 506, 508. The buffers enhance the accuracy with which the latency associated with the global H-tree clock is estimated. Similarly, after forming the subtrees that include the tap points, the clock sinks and any associated ICGs, to enhance the accuracy in estimating the latency associated with each subtree, one or more stages of buffer is used between each tap point and its associated clock sink. An accurate estimate of the latency associated with each clock subtree may then be provided. The estimated latencies associated with the global H-tree and the subtrees are used to determine the cost associated with the tap points, as described further below.

The buffers sizes are determined based on a number of factors, such as their physical locations and their distances from the clock sinks they are assigned to drive, the amount of load associated with the clock sinks they are assigned to drive, and the like. The buffer sizes (i.e., drive strengths) used in the global tree between the tree root and the tap drivers are often larger than the buffer sizes used in the sub-trees. A number of different buffer sizes are often available in a cell library from which the buffers used in estimating the latencies may be selected.

Figure 6:
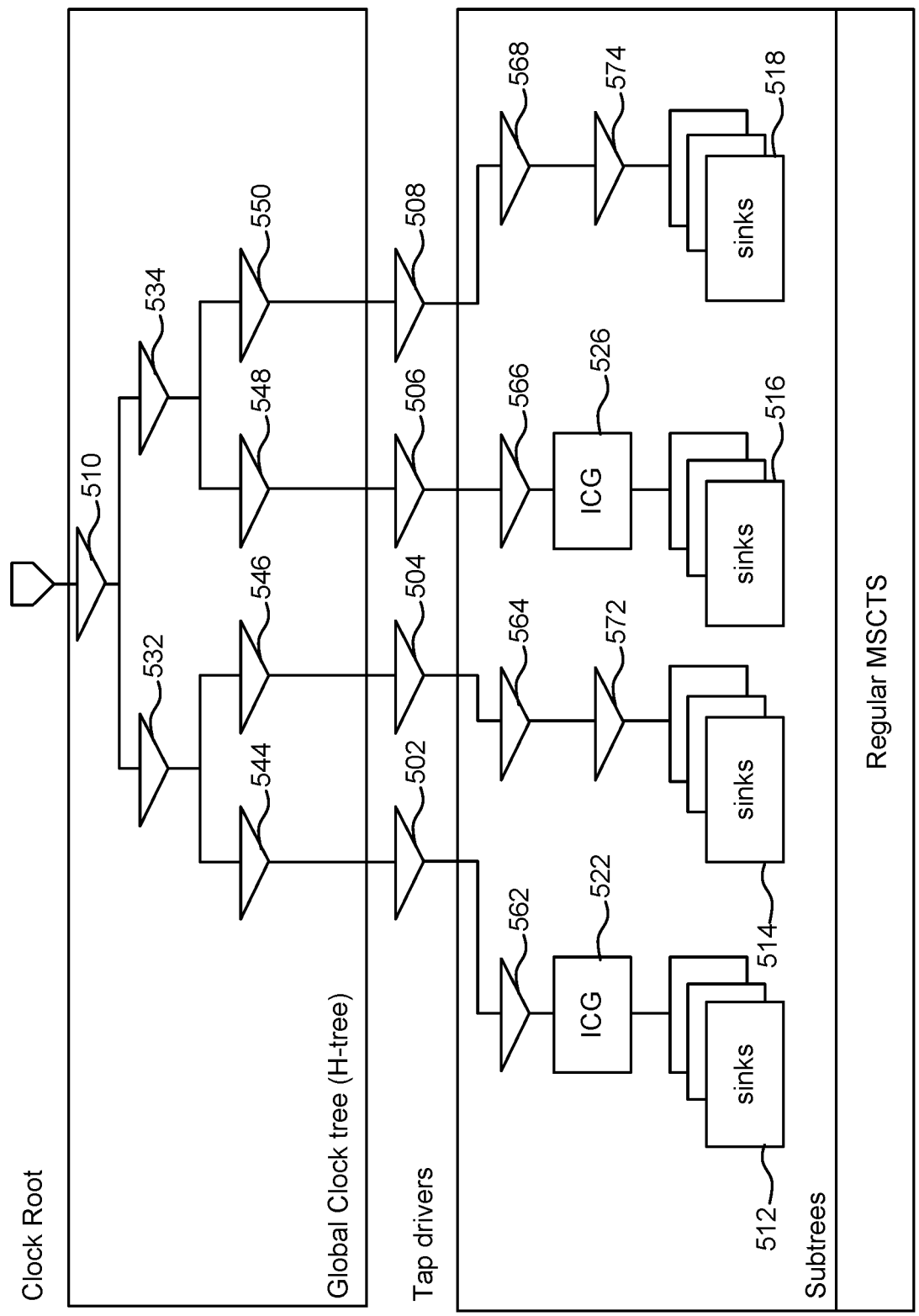
FIG. 6 shows the clock distribution network of FIG. 5 after inclusion of one or more buffer stages in its global clock tree and its subtrees, in accordance with one embodiment of the present disclosure.

FIG. 6 is similar to FIG. 5, except that in FIG. 6 the buffers that are used in the global H-tree, and the subtrees are shown. Buffers 532 and 534 form a first buffer stage used between the tree root and the tap points. Buffers 544, 546, 548 and 550 form a second buffer stage used between the tree root and the tap points. Buffer 562 is used in the subtree formed between tap point 502 and clock sink 512; buffers 564 and 572 are used in the subtree formed between tap point 504 and clock sink 514; buffer 566 is used in the subtree formed between tap point 506 and clock sink 516; and buffers 568 and 574 are used in the subtree formed between tap point 508 and clock sink 518.

Due to the symmetry of the global H-tree clock, the estimated latency associated with the tree root to the tap points is the same for all branches of the global tree.

However, the estimated latency from the tap points to their respective clock sinks are often different. Therefore, for the example shown in FIG. 6, there may be 4 different latency estimations each associated with a different one of the subtrees. The maximum of the four estimated latencies associated with the four subtree latencies together with the H-tree latency is the cost associated with the clock configuration shown in FIG. 6. For example, if the estimated latency from tap point 506 to clock sink 516 is greater than (i) the estimated latency from tap point 502 to clock sink 512, and the estimated latency from tap point 504 to clock sink 514, and (iii) the estimated latency from tap point 508 to clock sink 518, then the estimated latency associated with the clock configuration shown in FIG. 6 is the sum of the estimated latency from tree root 505 to any of the tap points 502, 504, 506, 508, and the estimated latency from tap point 506 to clock sink 516. If the estimated latency is selected in determining the cost associated with a clock configuration, then the cost associated with the clock configuration shown in FIG. 6 is the sum of the estimated latency from tree root 505 to any of the tap points 502, 504, 506, 508, and the estimated latency from tap point 506 to clock sink 516.

In some embodiments of the present disclosure, the clock skew associated with the subtrees may be used in determining the cost associated with a clock configuration. The skew is defined by a sum of the differences of each subtree latency and the maximum of subtree latencies. In some embodiments, a combination, such as a weighted combination, of the latency and skew are used in determining the cost associated with a clock configuration.

In accordance with embodiments of the present disclosure, the cost associated with each of the m×n symmetric clock configurations—as described above with reference to FIGS. 2A-2D—as well as the asymmetric clock configurations—as described above with reference to FIGS. 3 and 4A-4F—is determined in the same manner as was described above with reference to FIGS. 5 and 6. In one embodiment, the clock configuration that has the lowest estimated cost is synthesized and used as the optimal clock configuration. In another embodiment, the clock configuration that has the lowest estimated skew may be synthesized and used as the optimal clock configuration. In yet other embodiments, the clock configuration that has the lowest combination of the latency and clock skew may be synthesized and used as the optimal clock configuration.

If a symmetric clock configuration is determined as providing the lowest estimated cost, based on the latency, skew, or a combination of latency and skew, then a symmetric H-tree is synthesized for use with the global clock tree, as shown and described with reference to FIGS. 5 and 6. If an symmetric clock configuration is determined as providing the lowest cost, based on the latency, skew, or a combination of latency and skew, then an asymmetric clock tree is synthesized for use with the global clock tree. Such an asymmetric clock tree is delay balanced so that the delays from the tree root to the sinks are substantially similar.

Figure 7:
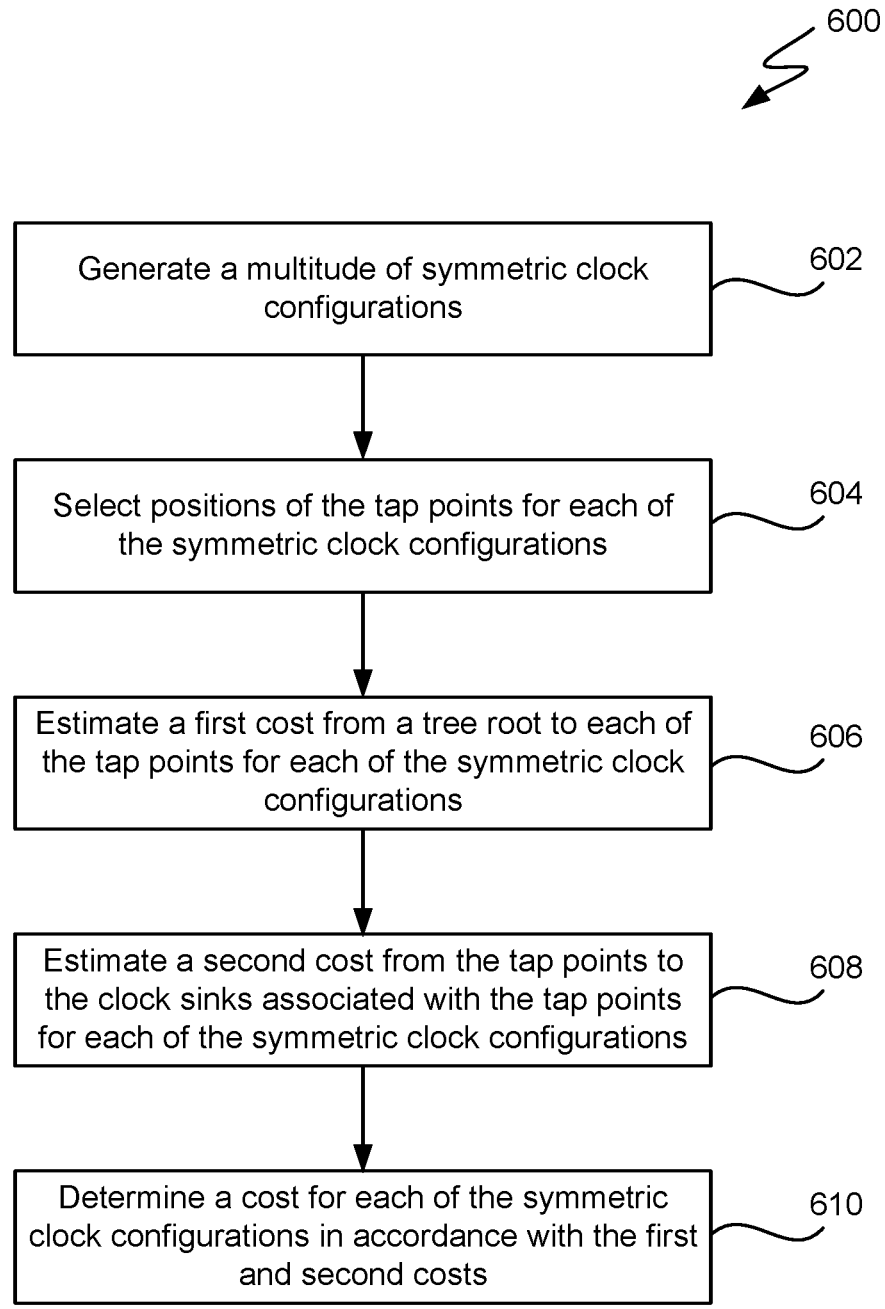
FIG. 7 is a flowchart for determining a symmetric clock configuration, in accordance with one embodiment of the present disclosure.

FIG. 7 is a flowchart 600 for determining a clock tree for a circuit, in accordance with one embodiment of the present disclosure. At 602 a multitude of symmetric clock configurations are generated. At 604 the positions of a multitude of tap points for each of the symmetric clock configurations are selected. At 606 a first cost from a tree root to each of the tap points for each of the symmetric clock configurations is estimated. At 608 a second cost from the tap points to the clock sinks associated with the points is estimated. At 610, the cost of each symmetric clock configuration is determined in accordance with the first and second costs.

Figure 8:
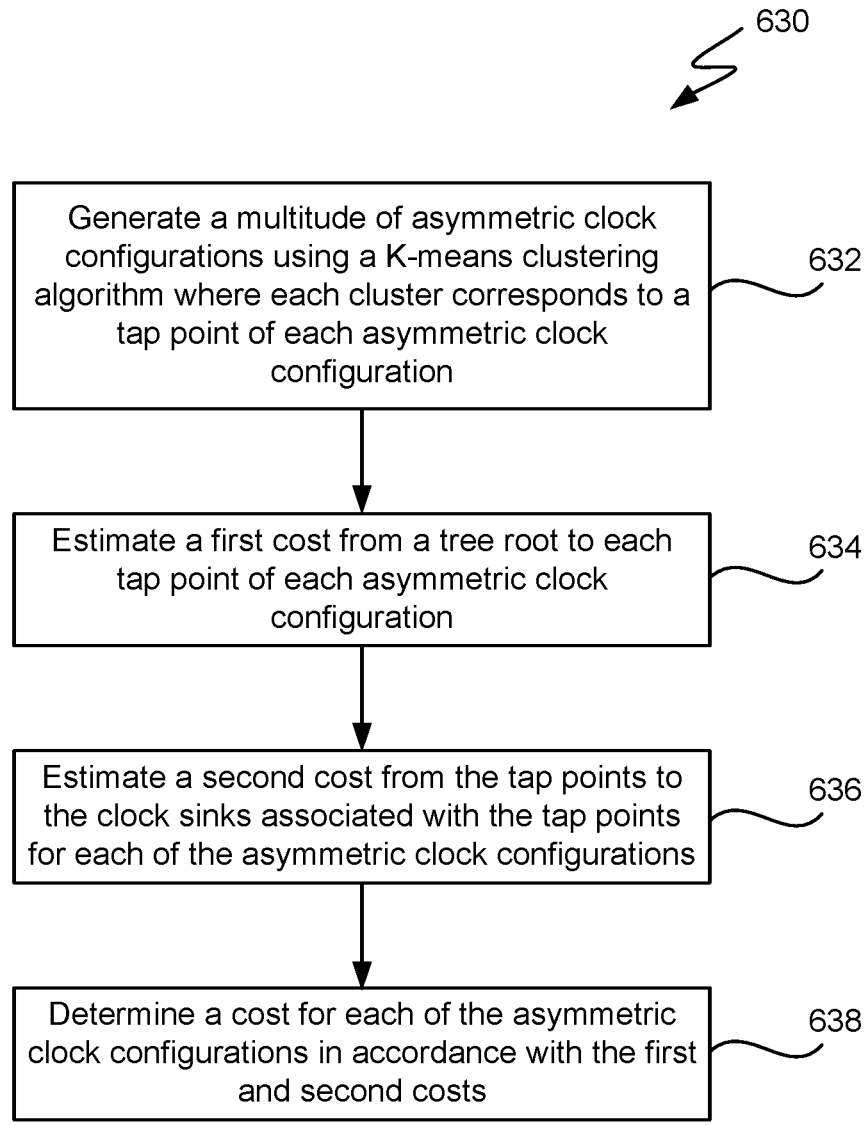
FIG. 8 is a flowchart for determining an asymmetric clock configuration, in accordance with one embodiment of the present disclosure.

FIG. 8 is a flowchart 630 for determining a clock tree for a circuit, in accordance with another embodiment of the present disclosure. At 632 a multitude of asymmetric clock configurations are generated using a k-means clustering algorithm. Each cluster corresponds to a tap point of an asymmetric clock configuration. At 634 a first cost from a tree root to each tap point of each of the asymmetric clock configurations is estimated. At 636 a second cost from the tap points to the clock sinks associated with the points is estimated for each of the asymmetric clock configurations. At 638, the cost of each asymmetric clock configuration is determined in accordance with the first and second costs.

Figure 9:
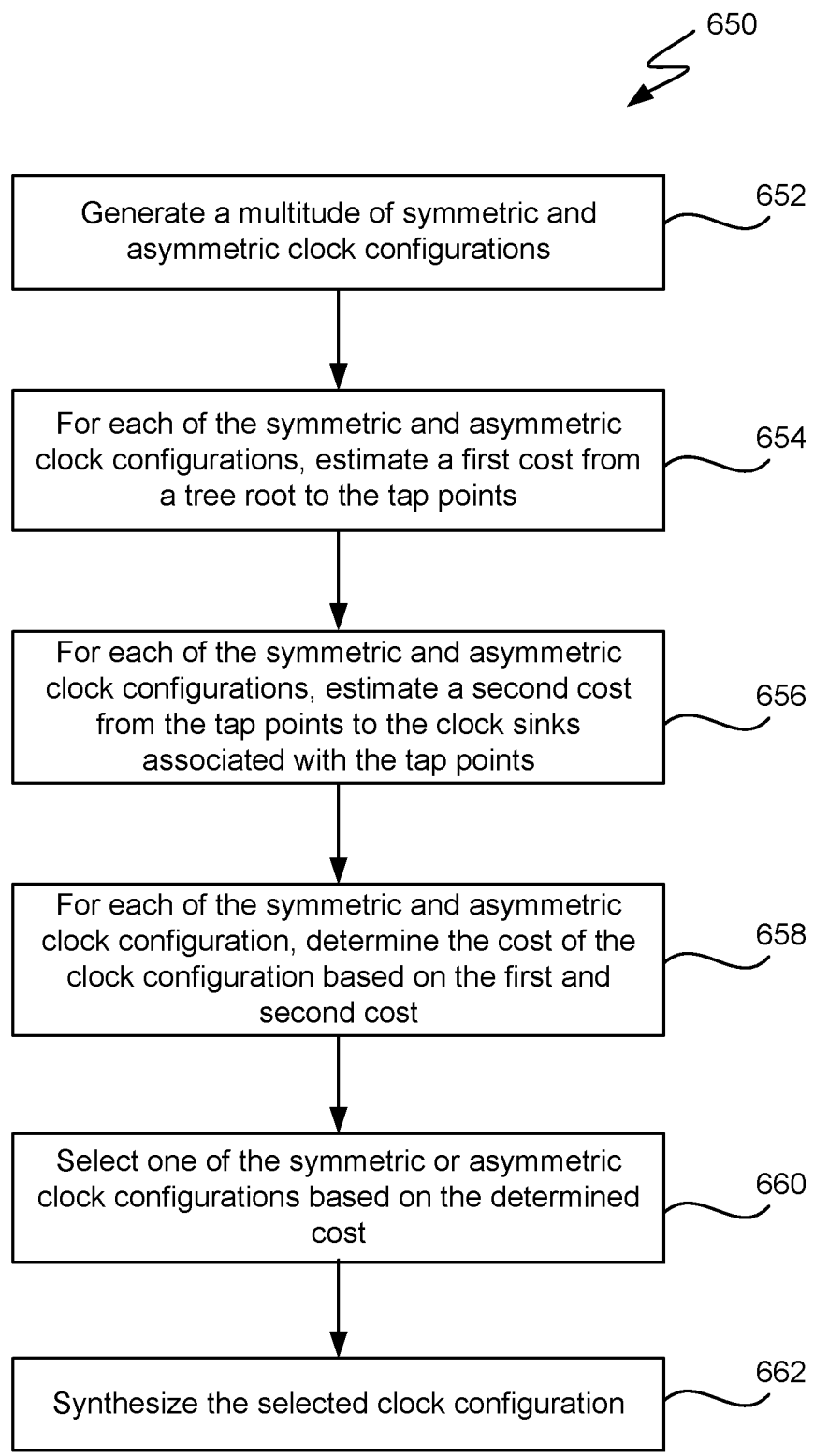
FIG. 9 is a flowchart for selecting a clock configuration from among a multitude of symmetric and asymmetric clock configurations, in accordance with one embodiment of the present disclosure.

FIG. 9 is a flowchart 650 for selecting and/or synthesizing a clock tree for a circuit, in accordance with another embodiment of the present disclosure. At 652, a multitude of symmetric and asymmetric clock configurations are generated. At 654, for each of the symmetric and asymmetric clock configurations, a first cost from a tree root to the tap points of the clock configuration is estimated. At 656, for each of the symmetric and asymmetric clock configurations, a second cost from the tap points to the clock sinks associated with the tap points is estimated. At 658, for each of the symmetric and asymmetric clock configurations, the clock configuration cost is determined based on the first and second costs. At 660, one of the symmetric or asymmetric clock configurations is selected based on the determined costs. At 662, the select clock configuration is synthesized.

Figure 10:
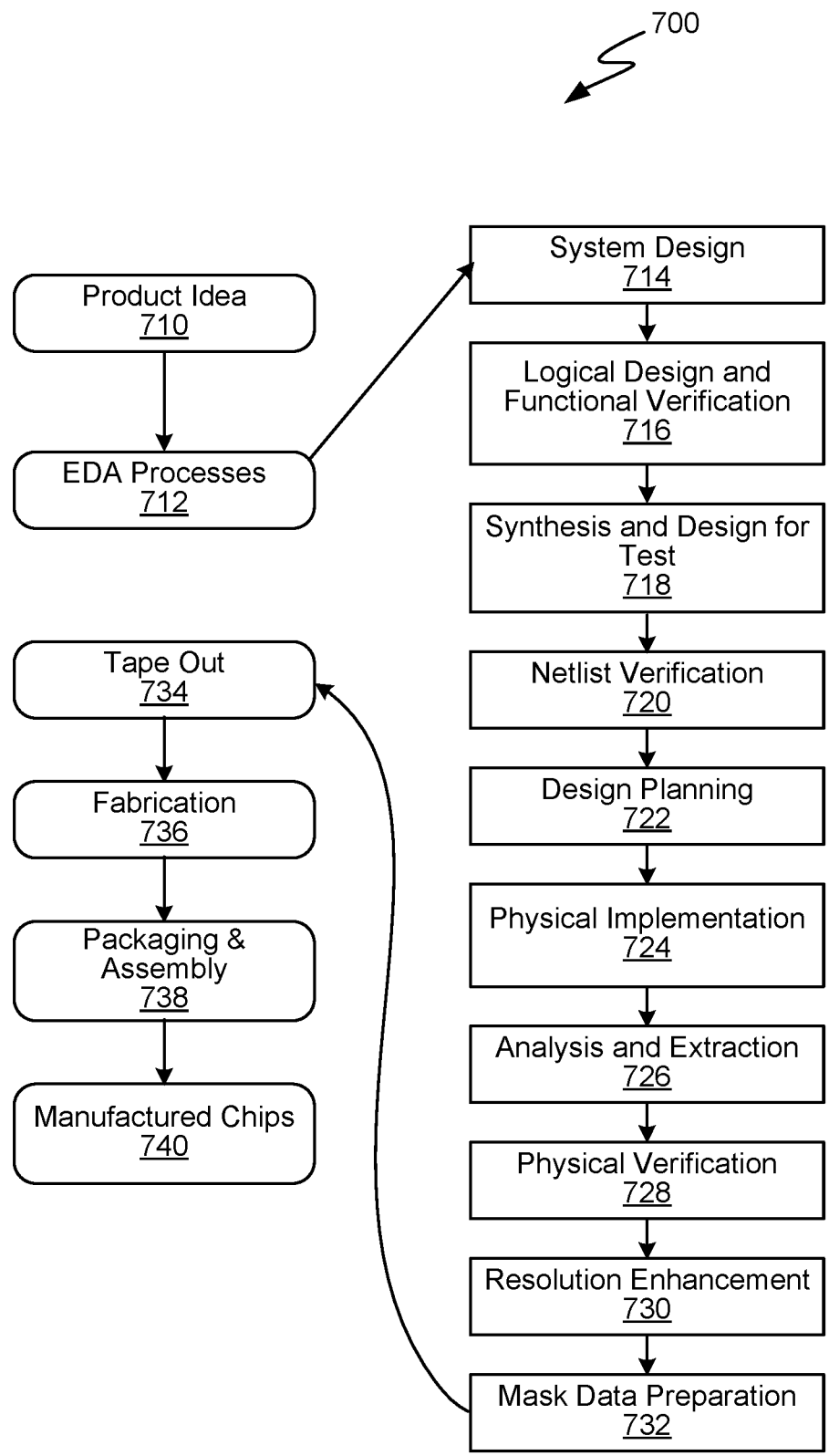
FIG. 10 depicts a flowchart of various processes used during the design and manufacture of an integrated circuit in accordance with some embodiments of the present disclosure.

FIG. 10 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 10. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 11:
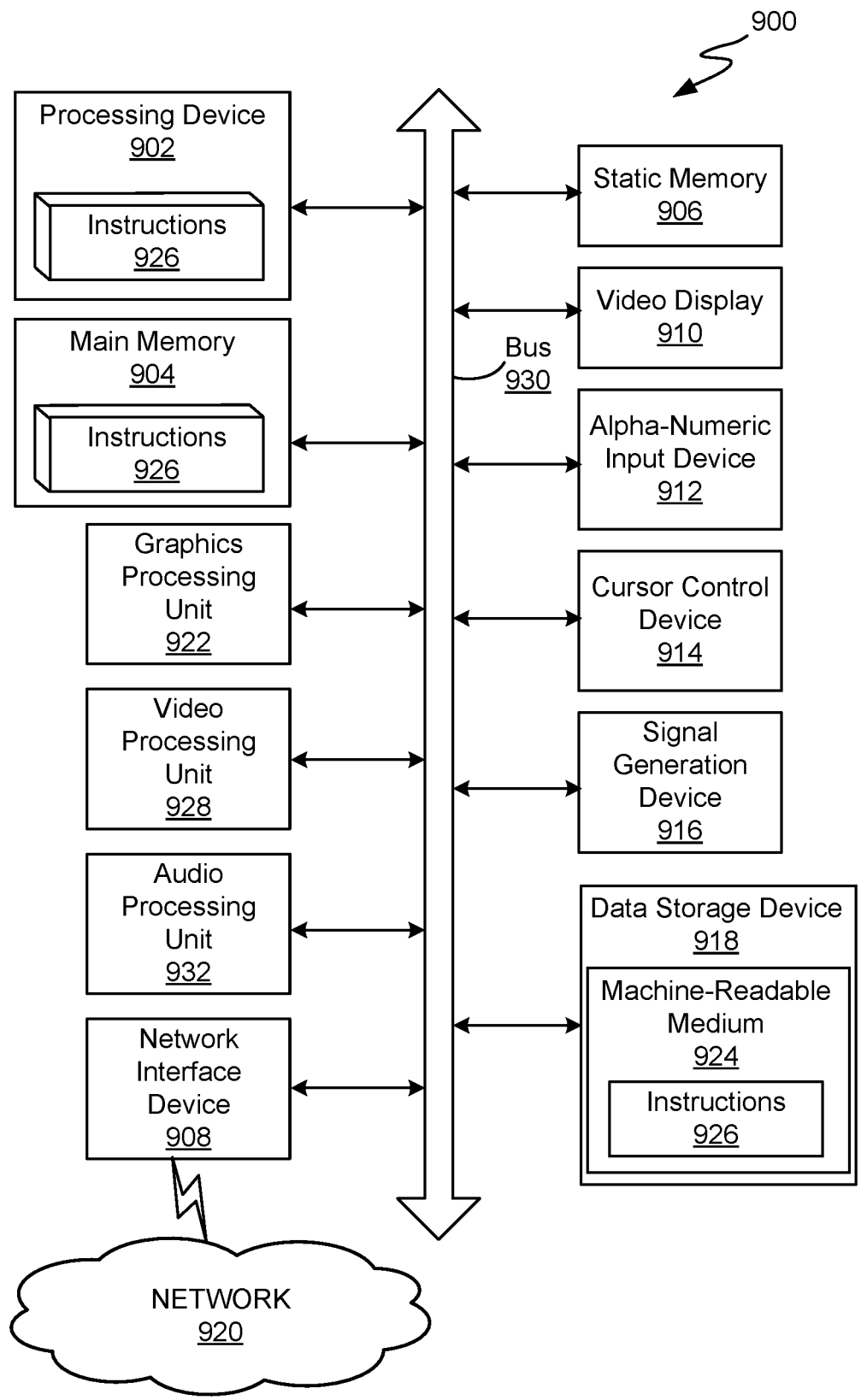
FIG. 11 depicts a diagram of an example computer system in which embodiments of the present disclosure may operate.

FIG. 11 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A method of determining a clock tree for a circuit, the method comprising:
   generating, by a processing device, a plurality of symmetric clock configurations characterized by a plurality of columns and a plurality of rows;
   for each of the plurality of the symmetric clock configurations:
      selecting positions of a plurality of tap points defined by a plurality of end points of the plurality of rows;
      estimating a first cost from a tree root to each of the first plurality of tap points;
      estimating a second cost from the plurality of tap points to a plurality of clock sinks associated with the plurality of tap points; and
      determining the symmetric clock configuration cost in accordance with the first cost and the second cost.

2. The method of claim 1 wherein estimating the first cost comprises:
   using at least a first delay associated with at least a first buffering stage between a first one of the plurality of tap points and the tree root.

3. The method of claim 2 wherein estimating the second comprises:
   using at least a second delay associated with at least a second buffering stage between the first one of the plurality of tap points and a clock sink associated with the first one of the plurality of tap points.

4. The method of claim 3 wherein a drive strength of the at least first buffering stage is greater than a drive strength of the at least second buffering stage.

5. The method of claim 4 wherein each of the first and second costs is defined by a latency.

6. The method of claim 4 wherein each of the first and second costs is defined by a clock skew.

7. The method of claim 4 wherein each of the first and second costs is defined by a combination of latency and clock skew.

8. A method of determining a clock tree for a circuit, the method comprising:
  generating, by a processing device, a plurality of asymmetric clock configurations using a k-means clustering algorithm, wherein each cluster corresponds to a tap point of each of the asymmetric clock configurations;
  for each of the plurality of the asymmetric clock configurations:
    estimating a first cost from a tree root to each of a plurality of tap points of the asymmetric clock configuration;
    estimating a second cost from the plurality of tap points to a plurality of clock sinks associated with the plurality of tap points; and
    determining the asymmetric clock configuration cost in accordance with the first cost and the second cost.

9. The method of claim 8 wherein estimating the first cost comprises:
  using at least a first delay associated with at least a first buffering stage between a first one of the plurality of tap points and the tree root.

10. The method of claim 9 wherein estimating the second comprises:
  using at least a second delay associated with at least a second buffering stage between the first one of the plurality of tap points and a clock sink associated with the first one of the plurality of tap points.

11. The method of claim 10 wherein a drive strength of the at least first buffering stage is greater than a drive strength of the at least second buffering stage.

12. The method of claim 8 wherein each of the first and second costs is defined by a latency.

13. The method of claim 4 wherein each of the first and second costs is defined by a clock skew.

14. The method of claim 7 wherein each of the first cost and second cost is defined by a combination of a latency and a clock skew.

15. A method of synthesizing a clock tree for a circuit, the method comprising:
  generating, by a processing device, a plurality of symmetric and asymmetric clock configurations;
  for each of the plurality of the symmetric and asymmetric clock configurations:
    estimating a first cost from a tree root to each of a plurality of tap points associated with the clock configuration;
    estimating a second cost from the plurality of tap points to a plurality of clock sinks associated with the plurality of tap points; and
    determining the clock configuration cost based on the first and second costs;
  selecting one clock configuration from the plurality of the symmetric clock configurations and the asymmetric clock configurations based on the determined cost; and
  synthesizing the selected clock configuration.

16. The method of claim 15 wherein estimating the first cost comprises:
  using at least a first delay associated with at least a first buffering stage between a first one of the plurality of tap points and the tree root.

17. The method of claim 16 wherein estimating the second cost comprises:
  using at least a second delay associated with at least a second buffering stage between the first one of the plurality of tap points and a clock sink associated with the first one of the plurality of tap points.

18. The method of claim 17 wherein a drive strength of the at least first buffering stage is greater than a drive strength of the at least second buffering stage.

19. The method of claim 15 wherein each of the first and second costs is defined by a latency.

20. The method of claim 15 wherein each of the first and second costs is defined by a clock skew.

* * * * *